United States Patent
Malek et al.

(10) Patent No.: US 9,042,105 B2
(45) Date of Patent: May 26, 2015

(54) ELECTRONIC DEVICES WITH PRINTED CIRCUIT BOARDS HAVING PADDED OPENINGS

(75) Inventors: Shayan Malek, San Jose, CA (US); Michael B. Wittenberg, Sunnyvale, CA (US); John Ardisana, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 344 days.

(21) Appl. No.: 13/530,038

(22) Filed: Jun. 21, 2012

(65) Prior Publication Data
US 2013/0343015 A1  Dec. 26, 2013

(51) Int. Cl.
| | |
|---|---|
| H05K 1/00 | (2006.01) |
| H05K 7/14 | (2006.01) |
| H05K 1/11 | (2006.01) |
| H05K 1/09 | (2006.01) |
| H05K 1/02 | (2006.01) |
| H05K 3/42 | (2006.01) |
| G06F 1/18 | (2006.01) |
| H05K 5/00 | (2006.01) |

(52) U.S. Cl.
CPC ............... *H05K 7/1417* (2013.01); *H05K 1/11* (2013.01); *H05K 1/09* (2013.01); *H05K 1/0201* (2013.01); *H05K 3/42* (2013.01); *H05K 5/0043* (2013.01); *H05K 5/0047* (2013.01); *H05K 5/0073* (2013.01); *H05K 5/0052* (2013.01); *H05K 1/0204* (2013.01); *H05K 1/0215* (2013.01); *H05K 2201/0314* (2013.01); *G06F 1/183* (2013.01)

(58) Field of Classification Search
CPC ..... H05K 3/42; H05K 5/0073; H05K 5/0043; H05K 5/0047; H05K 5/0052

USPC ......... 361/748, 752, 753, 758, 759, 785, 786, 361/796, 799, 801, 803, 804
See application file for complete search history.

(56) References Cited

U.S. PATENT DOCUMENTS

| | | | | |
|---|---|---|---|---|
| 4,774,634 | A | 9/1988 | Tate et al. | |
| 4,875,140 | A * | 10/1989 | Delpech et al. | ............... 361/789 |
| 5,296,652 | A * | 3/1994 | Miller, Jr. | ..................... 174/265 |
| 5,363,276 | A * | 11/1994 | Crockett | ..................... 361/752 |

(Continued)

OTHER PUBLICATIONS

Dinh et al., U.S. Appl. No. 12/794,599, filed Jun. 4, 2010.

*Primary Examiner* — Hoa C Nguyen
*Assistant Examiner* — Binh Tran
(74) *Attorney, Agent, or Firm* — Treyz Law Group; Joseph F. Guihan; Kendall P. Woodruff

(57) ABSTRACT

An electronic device may be provided with a printed circuit board having padded through-holes. The padded through-holes may be formed from openings in a printed circuit board substrate and elastomeric members in the openings. The elastomeric members may be conductive elastomeric members such as electrically or thermally conductive elastomeric members. The printed circuit board may be secured within a housing for the electronic device using engagement members that extend through padded through-holes. The engagement members may engage with the housing or with additional engagement members that are attached to the housing. The electronic device may include a cowling structure formed over electronic components on a surface of the printed circuit board. The cowling structure may be secured to the printed circuit board using attachment members that engage with the engagement members in the padded through-holes.

22 Claims, 8 Drawing Sheets

(56) References Cited

U.S. PATENT DOCUMENTS

| | | |
|---|---|---|
| 6,181,567 B1 * | 1/2001 | Roemer et al. .................. 361/760 |
| 6,362,978 B1 * | 3/2002 | Boe ................................ 361/825 |
| 6,904,300 B1 | 6/2005 | Maattanen et al. |
| 7,025,640 B2 | 4/2006 | Eichorn et al. |
| 7,733,667 B2 * | 6/2010 | Qin et al. ....................... 361/804 |
| 8,027,164 B2 * | 9/2011 | Peck .............................. 361/730 |
| 2007/0159777 A1 | 7/2007 | Shin |
| 2010/0142166 A1 * | 6/2010 | Chang et al. ................... 361/759 |
| 2011/0108312 A1 | 5/2011 | Becze et al. |

* cited by examiner

ELECTRONIC DEVICES WITH PRINTED CIRCUIT BOARDS HAVING PADDED OPENINGS

BACKGROUND

This relates generally to electronic devices and components for electronic devices.

Electronic devices such as cellular telephones and tablet computers include numerous electronic and mechanical components. An electronic device commonly includes one or more housing structures that form an enclosure for the device. The electronic and mechanical components are mounted in the housing.

Electronic components for an electronic device often include a printed circuit board. The printed circuit board is sometimes mounted within the housing by securing a portion of the printed circuit board to the housing. During a drop event, undesirable stresses may be exerted on the portion of the printed circuit board that is secured to the device housing.

It would therefore be desirable to be able to provide improved electronic devices and parts for electronic devices.

SUMMARY

Electronic devices may be provided that include mechanical and electronic components. These components may include mechanical structures such as mounting structures and electrical components such as integrated circuits, printed circuit boards, and electrical devices that are mounted to printed circuit boards. Optical components, connectors, antennas, buttons, and other structures may be included in an electronic device.

An electronic device may have a housing. Electronic components and mechanical structures may be formed within the housing. The electronic components may include one or more printed circuit boards. A printed circuit board may be mounted to the housing.

In order to provide a robust assembly that protects internal components of the device during a drop event, a printed circuit board may be provided with padded openings such as padded through-holes. The padded openings may include holes in the printed circuit board that are partially filled with elastomeric members. An elastomeric member may, if desired, be an over-molded elastomeric member in an opening in the printed circuit board.

The printed circuit board may be secured to the housing of the device by inserting engagement members through the padded openings in the printed circuit board and into receiving members that are attached to the device housing. A receiving member may be attached to the device housing and may include an opening for receiving the engagement members.

The engagement members may include a central opening for receiving an additional engagement member such as a screw, clip, plug, or other attachment member. The printed circuit board may be secured to the housing of the device by inserting the additional engagement members into the engagement members that have been inserted through the padded openings in the printed circuit board and into receiving members that are attached to the device housing.

If desired, an additional internal support structure may be secured to the printed circuit board by inserting the additional engagement members through openings in the additional support structure and into the openings in the engagement members that have been inserted through the padded openings in the printed circuit board and into receiving members that are attached to the device housing.

Further features of the invention, its nature and various advantages will be more apparent from the accompanying drawings and the following detailed description.

DETAILED DESCRIPTION

Electronic devices can be provided with mechanical and electronic components such as optical parts, camera mounting structures, printed circuits, cowlings and other structural members, thermal management structures, buttons, vibrators, and other mechanical and electrical structures.

Electronic devices that may be provided with these components include desktop computers, computer monitors, computer monitors containing embedded computers, wireless computer cards, wireless adapters, televisions, set-top boxes, gaming consoles, routers, portable electronic devices such as laptop computers, tablet computers, and handheld devices such as cellular telephones and media players, and small devices such as wrist-watch devices, pendant devices, headphone and earpiece devices, and other wearable and miniature devices. Portable devices such as cellular telephones, media players, tablet computers and other handheld electronic devices are sometimes described herein as an example.

A rigid printed circuit board may be provided with padded through-holes. Padded through-holes may include openings in the rigid printed circuit board that are partially filled with an elastomeric member. Engagement members that extend through the padded through-holes may be used to secure the printed circuit board to other components of the electronic device. A support structure such as a cowling structure may be mounted to the rigid printed circuit board so as to overlap one or more electronic components such as integrated circuits and printed circuit board connectors on the rigid printed circuit board.

To ensure adequate thermal dissipation from the rigid printed circuit board, a thermally conductive filler such as silicone filled with thermally conductive particles may be used to form the elastomeric member. To ensure grounded electrical contact between the rigid printed circuit board and other device components, an electrically conductive filler such as silicone filled with electrically conductive particles may be used to form the elastomeric member. If desired, electrically and thermally conductive particles may be used to form an electrically and thermally conductive elastomeric member.

Figure 1:
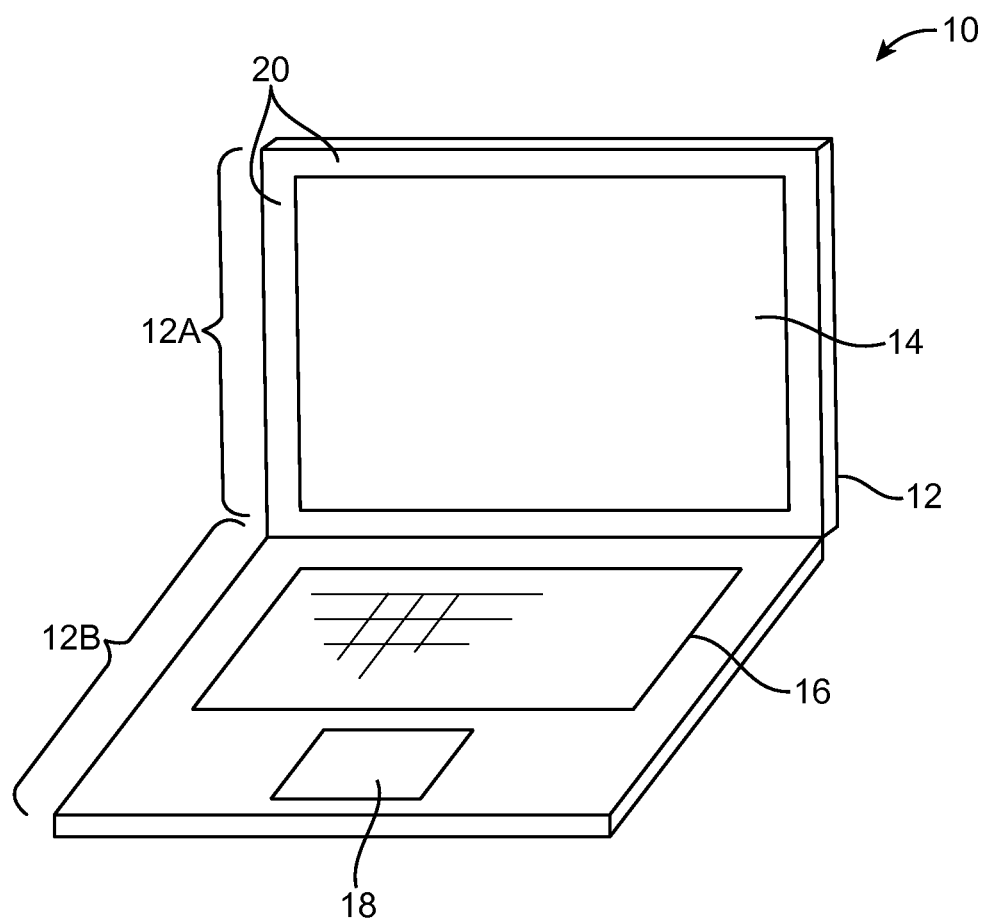
FIG. 1 is a perspective view of an illustrative electronic device such as a laptop computer with internal electrical and structural components in accordance with an embodiment of the present invention.
Figure 2:
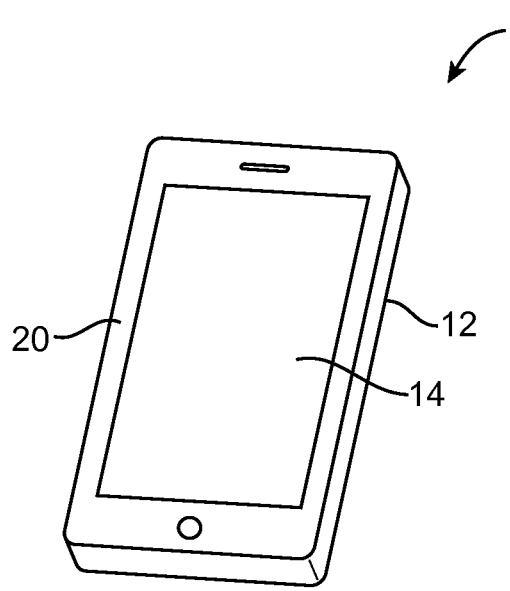
FIG. 2 is a perspective view of an illustrative electronic device such as a handheld electronic device with internal electrical and structural components in accordance with an embodiment of the present invention.
Figure 3:
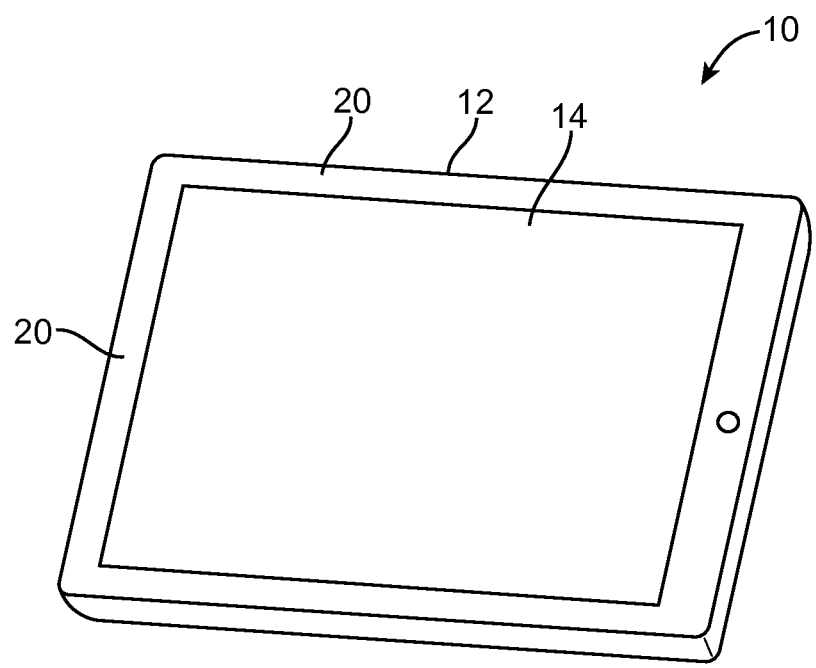
FIG. 3 is a perspective view of an illustrative electronic device such as a tablet computer with internal electrical and structural components in accordance with an embodiment of the present invention.

Illustrative electronic devices that may be provided with printed circuit boards with padded through-holes for improving device robustness (e.g., in drop events) are shown in FIGS. 1, 2, and 3. FIG. 1 shows how electronic device 10 may have the shape of a laptop computer having upper housing 12A and lower housing 12B with components such as keyboard 16 and touchpad 18. A rigid printed circuit board and other device components such as electrical and structural components may be mounted within upper housing 12A and/or lower housing 12B.

FIG. 2 shows how electronic device 10 may be a handheld device such as a cellular telephone, music player, gaming device, navigation unit, or other compact device. A rigid printed circuit board and other device components such as electrical and structural components may be mounted within upper housing 12.

FIG. 3 shows how electronic device 10 may be a tablet computer. However, the examples of FIGS. 1, 2, and 3 are merely illustrative examples. Electronic devices such as illustrative electronic device 10 of FIGS. 1, 2, and 3 may be laptop computers, computer monitors with embedded computers, tablet computers, cellular telephones, media players, other handheld and portable electronic devices, smaller devices such as wrist-watch devices, pendant devices, headphone and earpiece devices, other wearable and miniature devices, or other electronic equipment.

Device 10 may have a housing enclosure such as housing 12. Housing 12, which is sometimes referred to as a case or enclosure, may be formed of materials such as plastic, glass, ceramics, carbon-fiber composites and other composites, metal, aluminum, other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements, welded standoffs, engagement structures, engagement member receiving structures, or other internal housing structures).

Device 10 may have one or more displays such as display 14. Display 14 may be an organic light-emitting diode (OLED) display or other suitable display. Display layer 14 may include display pixels formed from light-emitting diodes (LEDs), organic LEDs (OLEDs), plasma cells, electronic ink elements, liquid crystal display (LCD) components, or other suitable display pixel structures compatible with flexible displays. Display 14 may, if desired, include capacitive touch sensor electrodes for a capacitive touch sensor array or other touch sensor structures (i.e., display 14 may be a touch screen).

The display may have a planar rectangular active region in its center. The edges of the organic light-emitting diode display surround the active center region and form a rectangular peripheral ring. This border region may contain circuitry that does not emit light and is therefore referred to as the inactive portion of the display. The inactive portion of the display is shown as inactive border region 20 in FIGS. 1, 2, and 3.

Figure 4:
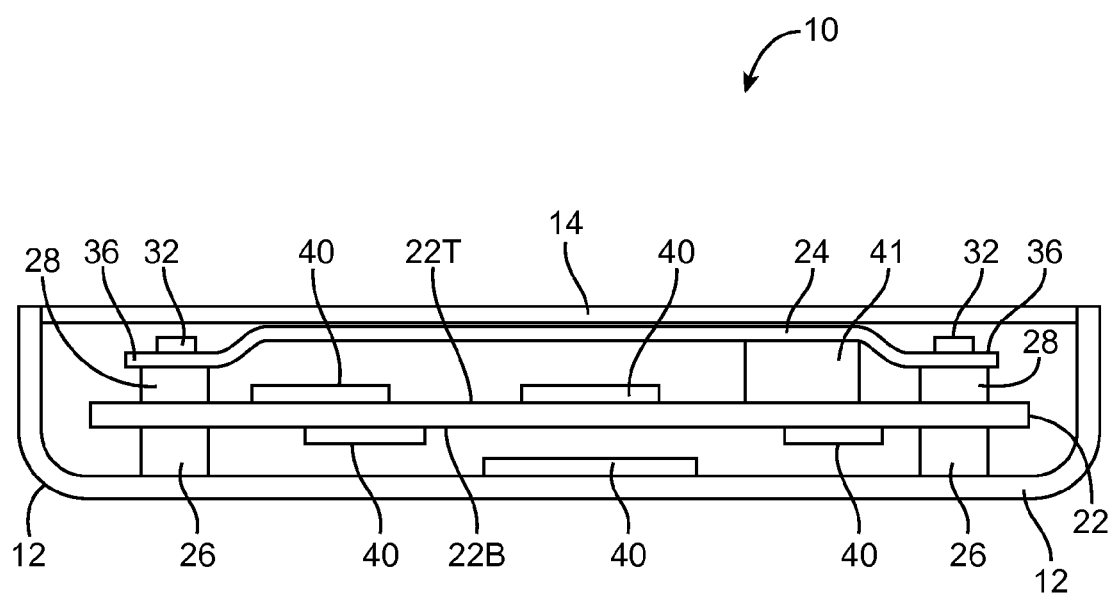
FIG. 4 is a cross-sectional side view of an illustrative electronic device with internal electrical and structural components in accordance with an embodiment of the present invention.

As shown in FIG. 4, device 10 may include electronic components such as printed circuit board 22 and components 40 and 41. Components 40 and 41 may include integrated circuits or other circuit components, batteries, cameras, compasses, wireless communications circuits, antennas, circuit board connectors such as board-to-board connectors or other circuitry.

Printed circuit board 22 and components 40 and 41 may be used to run software code for device 10, such as internet browsing applications, voice-over-internet-protocol (VOIP) telephone call applications, email applications, media playback applications, operating system functions, antenna and wireless circuit control functions, etc.

Printed circuit board 22 and components 40 and 41 may be used in implementing suitable communications protocols. Communications protocols that may be implemented using printed circuit board 22 and components 40 and 41 include internet protocols, wireless local area network protocols (e.g., IEEE 802.11 protocols—sometimes referred to as Wi-Fi®), protocols for other short-range wireless communications links such as the Bluetooth® protocol, protocols for handling cellular telephone communications services, etc.

Printed circuit board 22 may be include a rigid printed circuit board substrate formed form a material such as fiberglass-filled epoxy (e.g., FR4) or other suitable rigid printed circuit board materials or combinations of materials.

As shown in FIG. 4 components 40 may be mounted on top surface 22T and/or bottom surface 22B of printed circuit board substrate 22. If desired, device 10 may be provided with a structural member such as cowling 24. Some of components 40 may be mounted between printed circuit board 22 and cowling 24. Cowling structure 24 may be mounted to the rigid printed circuit board so as to provide a force on component 41 that presses component 41 against printed circuit board 22.

For example, a printed circuit board connector may be held against printed circuit board 22 using cowling structure 24 to help hold first and second portions of the printed circuit board connector in contact. A printed circuit board connector may have mating first and second portions. Printed circuit board connectors may be used to connect additional printed circuit boards such as rigid printed circuit boards and flexible printed circuits to printed circuit board 22. The first portion of a printed circuit board connector may be mounted to printed circuit board 22. The second portion may be connected to a flex circuit. Mating pins in the first and second portions may form electrical connections between the first and second portions of the connector.

As shown in FIG. 4, a support structure such as cowling structure 24 may include recessed portions 36. Cowling structure 24 may be formed from any suitable rigid material such as metal, plastic, glass, or other suitable rigid material. In one suitable configuration that is sometimes discussed herein as an example, cowling 24 may be formed from a piece of stamped sheet metal (e.g., aluminum, copper, or steel). Components such as display 14 may, if desired, be attached to cowling structure 24.

Structures such as standoffs 26 may be used to separate printed circuit board 22 from housing 12. Structures such as standoffs 28 may be used to separate printed circuit board 22 from a support structure such as cowling structure 24. Engagement members such as attachment members 32 may be inserted into engagement member such as standoff 28 through openings in portion 36 of cowling structure 24. Engagement members 32 may include threaded screws, clips, prongs, pins, snaps or other attachment members.

Figure 5:
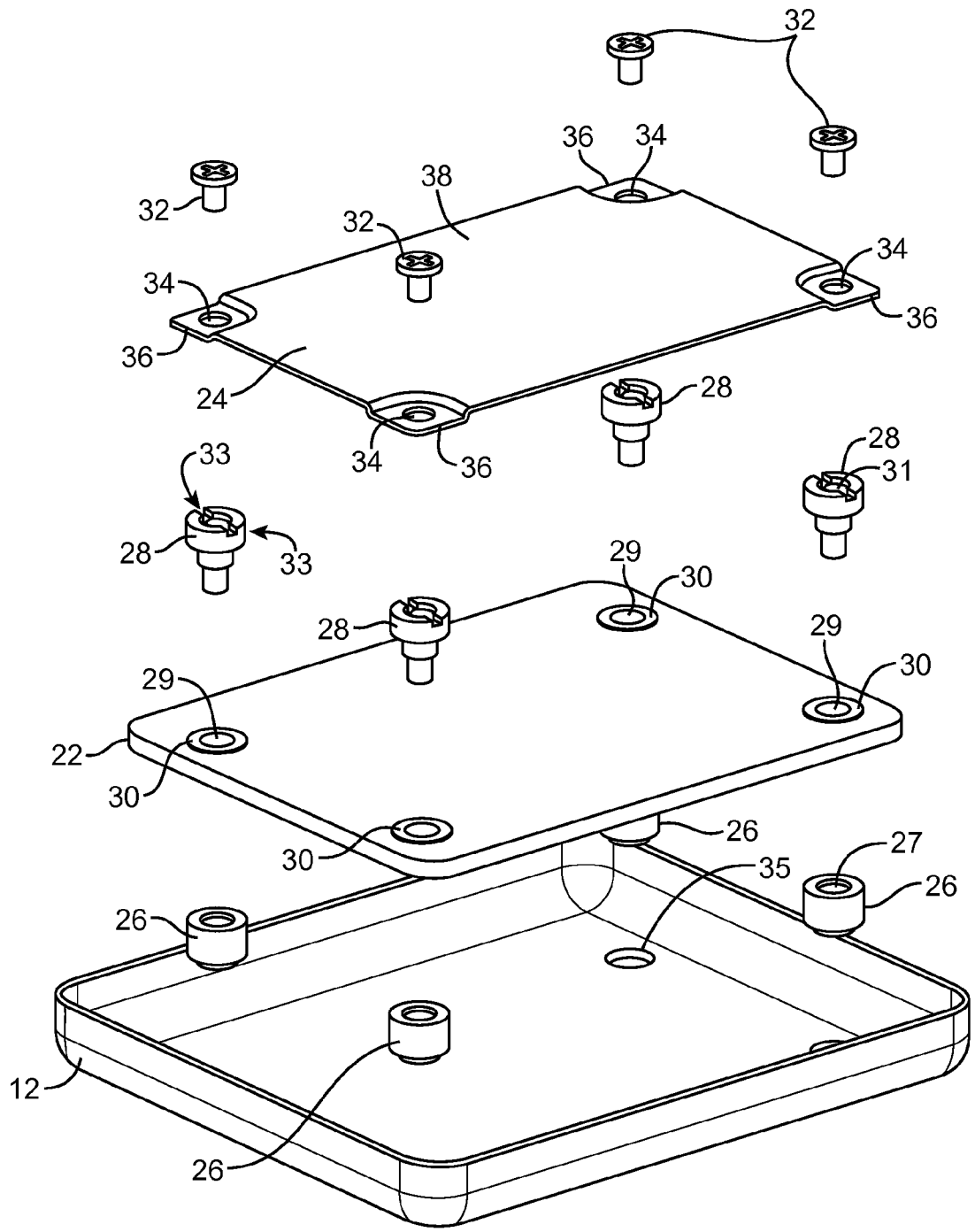
FIG. 5 is an exploded perspective view of illustrative structures that may be mounted to a device housing including a printed circuit board and a support structure in accordance with an embodiment of the present invention.

As shown in the exploded perspective view of FIG. 5, printed circuit board (PCB) 22 may include openings such as openings 29. In the example of FIG. 5, PCB 22 includes four openings. However, this is merely illustrative. If desired, PCB 22 may include one or more openings, two or more openings, three or more openings or five or more openings. PCB 22 may include openings such as openings 29 for receiving engagement members for securing PCB 22 to housing 12 and other openings such as through-holes, vias, recesses, etc. Printed circuit board 22 may be provided with elastomeric members 30 in openings 29. In this way, PCB 22 may be provided with padded openings that help prevent damage to PCB 22 during a drop event.

Elastomeric members 30 may be formed from a material having sufficient hardness to provide structural support for PCB 22 in device 10 and sufficient compressibility to alleviate stresses in PCB 22 near openings 29 in the event that device 10 is dropped or otherwise bumped or hit. As examples, a material having a hardness value such as a Shore® Durometer hardness value between 35 and 40, between 34 and 41, between 30 and 40, between 20 and 45, less than 40, less than 39, less than 38, between 36 and 38 or less than 50 may be used to form elastomeric members 30. Elastomeric members 30 may be formed from rubber, silicone, plastic, metal or other suitable materials having sufficient hardness to provide structural support for PCB 22 in device 10 and sufficient compressibility to alleviate stresses in PCB 22 near openings 29 in a drop event.

In one suitable configuration that is sometimes discussed herein as an example, elastomeric members 30 may be formed from silicone that is infused with thermally and/or electrically conductive particles. As examples, particles such as powdered copper, powdered zinc, powdered silver, and/or powdered nickel may be added to a silicone compound for forming elastomeric members 30.

Elastomeric members 30 with electrically conductive particles may be used to electrically couple other conductive members such as standoffs 26 and/or 28 to grounding structures such as a ground plane in PCB 22. Elastomeric members 30 with thermally conductive particles may be used to thermally couple PCB 22 to other thermally conductive parts such as cowling 24 in order to provide a thermally conductive path for transferring heat away from PCB 22 (e.g., to cowling 24 or to housing 12).

Elastomeric members 30 may be overmolded, inserted, snapped or otherwise formed into openings 29 in PCB 22 during assembly of device 10. Elastomeric members 30 may be formed in openings 29 before or after components such as components 40 and/or 41 (FIG. 4) have been attached to PCB 22. In configurations in which elastomeric members 30 are formed in openings 29 before components such as components 40 and/or 41 have been attached to PCB 22, elastomeric members may be formed from a material having a melting temperature that is high enough that the material will remain solid during soldering of electronic components (e.g., by reflowing solder under the electronic components during Surface Mount Assembly processes).

As shown in FIG. 5, engagement members such as standoffs 28 may include portions that may be inserted through openings such as openings 29 in printed circuit board 22 and into receiving engagement members such as standoffs 26. Standoffs 26 may be attached to housing 12. For example, standoffs 26 may be formed from metal material (e.g., steel) that is welded (e.g., laser welded) to housing 12, may be machined features of housing 12, or may be formed from metal, plastic, ceramic, glass or other materials or combinations of materials that are attached to housing 12 using adhesive, engagement features (e.g. clasps, threaded structures, etc.) or other attachment mechanisms. If desired, housing 12 may be provided with one or more recesses such as recess 35 that receive a portion of standoffs 26.

Engagement members such as standoffs 28 may be formed from plastic, ceramics, metal (e.g., aluminum) or other materials. During assembly of device 10, PCB 12 may be aligned with housing 12 by aligning openings 29 with corresponding openings in standoffs 26. Engagement members 28 may be inserted through openings 29 of PCB 22 and into openings such as openings 27 in standoffs 26. If desired, portions of engagement members 28 that have been inserted into openings 27 of standoffs 26 may be secured in openings 27 using adhesive, structural engagement features (e.g., screw threads or clasps on standoffs 28 that engage with features in openings 27) or other attachment mechanisms. As shown in FIG. 5, standoffs 28 may include features such as features 33 that receive an assembly tool such as a screw driver during assembly of device 10.

Additional engagement members such as screws 32 may be inserted into openings such as openings 31 in engagement members 28. Screws 32 may be secured in openings 31 using adhesive, structural engagement features (e.g., screw threads or clasps on standoffs 28 that engage with features in openings 31) or other attachment mechanisms. If desired, engaging screws 32 in openings 31 may expand engagement members 28 thereby securing engagement members 28 in openings 29.

As shown in FIG. 5, a structural member such as cowling 24 may be provided with openings such as openings 34 for receiving attachment members such as screws 32. Cowling 24 may be secured to PCB 22 by inserting screws 32 through openings 34 and into engagement members 28. If desired, openings 34 may be formed in recessed portions such as portions 36 of cowling 24 so that screw heads of screws 32 do not protrude above surface 38 of cowling 24.

Figure 6:
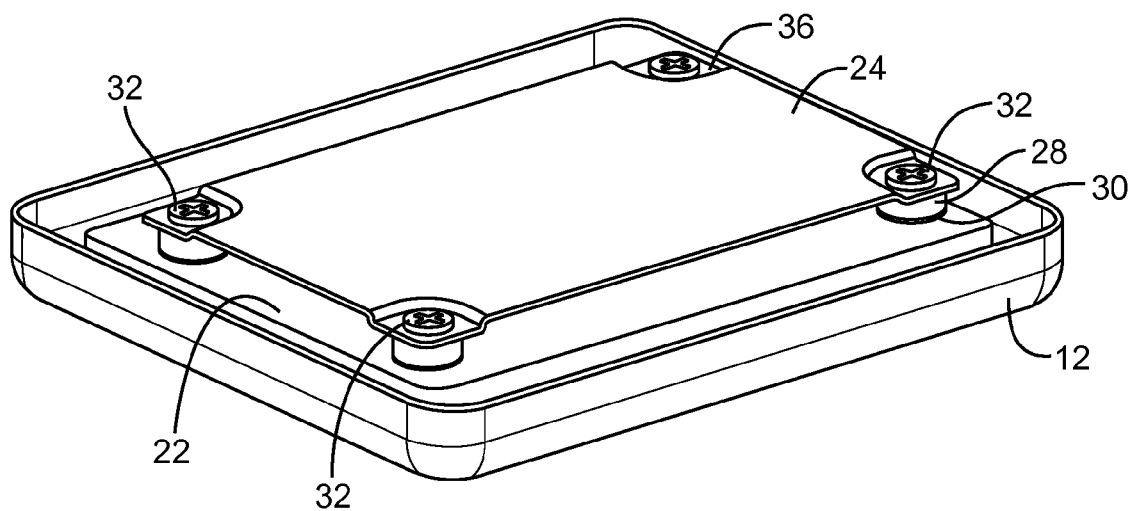
FIG. 6 is a perspective view of an illustrative electronic device of the type shown in FIG. 4 after securing the printed circuit board to the device housing in accordance with an embodiment of the present invention.

FIG. 6 shows the structures of FIG. 5 following assembly of the structures of FIG. 5 to form a portion of device 10. As shown in FIG. 6, PCB 22 and cowling 24 may be secured within housing 12 using screws 32. Space may be provided between cowling 24 and PCB 22 by standoffs 28 and recesses 36 in cowling 24. Standoffs 28 may be formed in contact with elastomeric members 30 and cowling 24. Elastomeric members 30 may provide a portion of an electrical and thermal conductive path between PCB 22 and standoffs 28, cowling 24, housing 12 and/or other structures within device 10. If desired, a portion of elastomeric members 30 may be formed in contact with an exposed portion of a ground plane in PCB 22 in order to provide electrical grounding to structures such as cowling 24.

Figure 7:
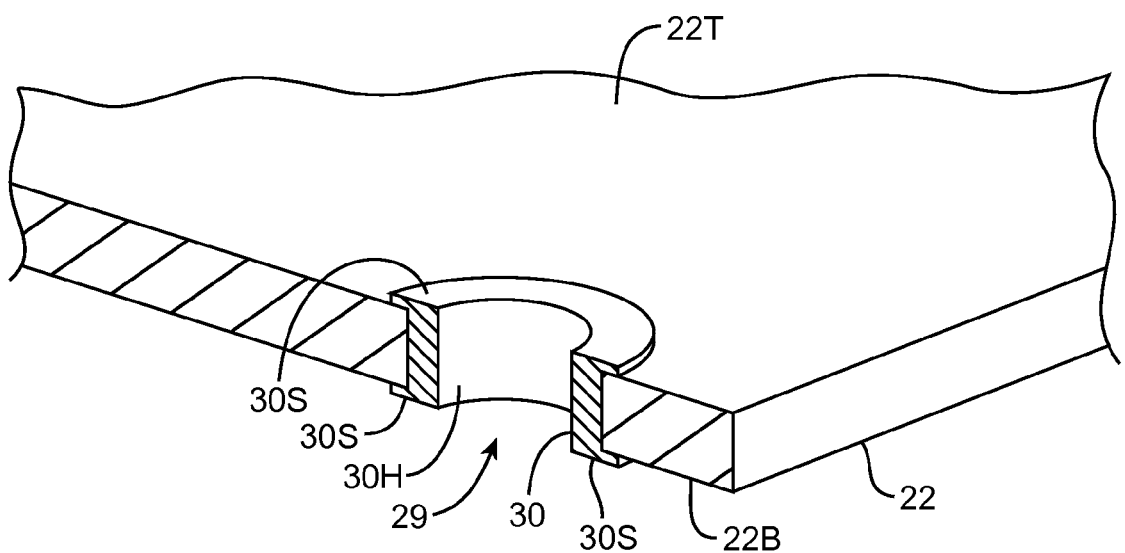
FIG. 7 is a perspective view of a portion of a printed circuit board having a padded through-hole that is partially filled with an elastomeric member in accordance with an embodiment of the present invention.

FIG. 7 shows how elastomeric members 30 may be formed in openings 29 in printed circuit board 22 having a portion in contact with top surface 22T, a portion in contact with bottom surface 22B, and a portion formed within opening 29 of PCB 22. As shown in FIG. 7, portions such as portions 30S may be formed along a surface of PCB 22. Portions 30H may be formed within openings 29. Portions 30S and/or portions 30H may be formed in contact with conductive structures in PCB 22. Portions 30S and portions 30H may be formed from a common material or from different materials. For example, portions 30S may be more or less electrically conductive than portions 30H or portions 30S may be more or less thermally conductive than portions 30H.

Figure 8:
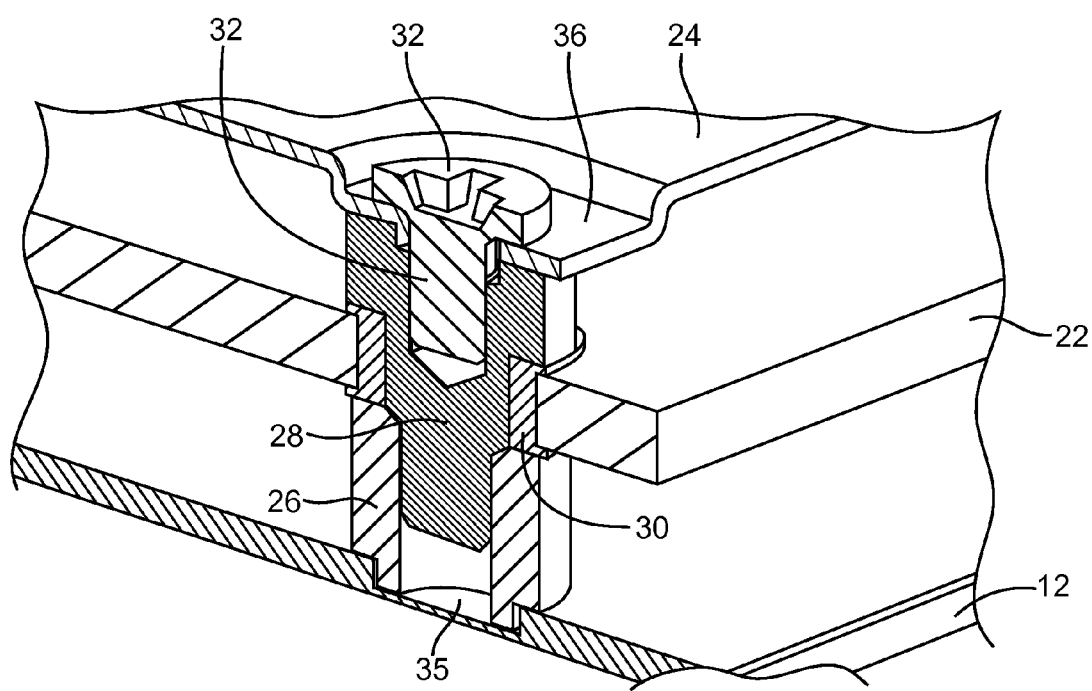
FIG. 8 is a perspective view of a portion of an illustrative electronic device having a printed circuit board that is secured to a device housing with an engagement member that is inserted through a padded opening in the printed circuit board into a receiving member and an additional engagement member that is inserted into an opening in the engagement member in accordance with an embodiment of the present invention.

FIG. 8 shows an illustrative assembled portion of device 10 in the vicinity of an opening in PCB 22. As shown in FIG. 8, a portion of engagement member 26 may be formed in a recess such as recess 35 of housing 12. A portion of engagement member 28 may be formed within an opening in engagement member 26, a portion of engagement member 28 may be formed within an opening in elastomeric member 30, and a portion of engagement member 28 may be formed between PCB 22 and cowling 24. A portion of engagement member 28 may be formed in contact with engagement member 26, a portion of engagement member 28 may be formed in contact with elastomeric member 30, and a portion of engagement member 28 may be formed in contact with cowling 24. A portion of elastomeric member 30 may be interposed between engagement member 26 and PCB 22. Other portions of elastomeric member 30 may be interposed between engagement member 28 and PCB 22. Members 26, 28, 32 and 30 may be formed from materials or combinations of materials suitably chosen to thermally or electrically couple or isolate PCB 22 from any component of device 10.

Figure 9:
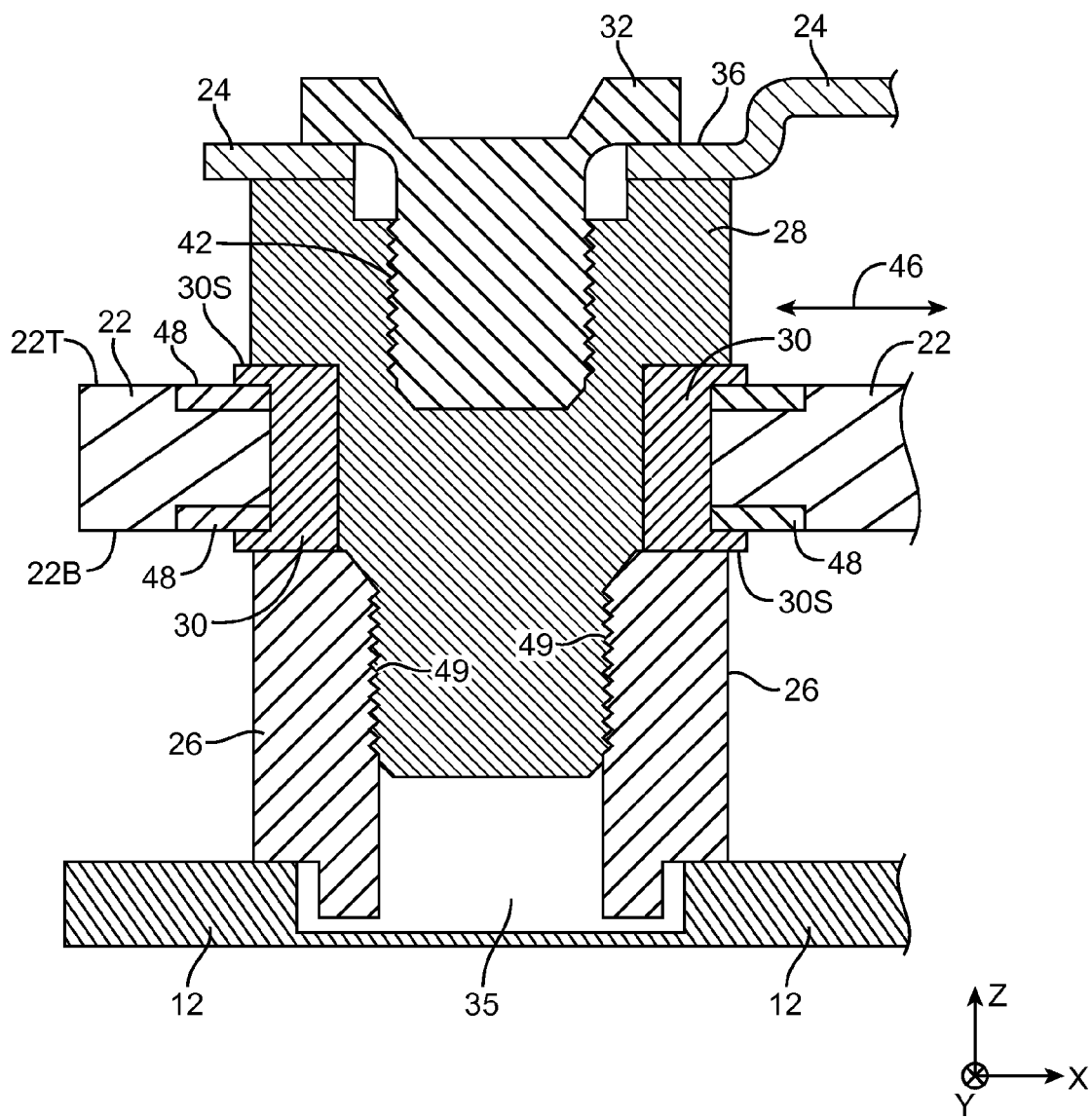
FIG. 9 is a cross-sectional side view of a portion of an illustrative electronic device having a printed circuit board that is secured to a device housing with an engagement member that is inserted through a padded opening in the printed circuit board into a receiving member and an additional engagement member that is inserted into an opening in the engagement member in accordance with an embodiment of the present invention.

As shown in FIG. 9, portions such as portions 30S of elastomeric members 30 may be formed in contact with a ground layer such as ground plane 48 of PCB 22. Ground plane 48 may be a layer of, for example, copper in PCB 22. A layer of solder mask material may be removed from one or more outer surfaces of PCB 22 in order to allow elastomeric members 30 to contact ground plane 48. However, this is merely illustrative. If desired a portion of a ground layer of PCB 22 that is not near the surface of PCB 22 may be formed in contact with elastomeric members 30 within openings in PCB 22 or elastomeric members 30 may be formed without contacting any conductive structures in PCB 22.

Attachment member (screw) 32 and engagement member 28 may be provided with respective engagement features 42 and 49 for engaging respectively with engagement member 28 and engagement member 26. In the example of FIG. 9, engagement features 42 and 49 have been implemented as threads for screwing screw 32 and engagement member 28 respectively into engagement member 28 and engagement member 26. However, this is merely illustrative. If desired, engagement features 42 and/or engagement features 49 may be implemented using any suitable features (e.g., snaps, clips, protrusions) for engaging screw 32 and engagement member 28 respectively into engagement member 28 and engagement member 26.

Padded through-holes in PCB 22 formed using elastomeric members 30 that partially fill openings in PCB 22 may help protect PCB 22 from damage in a drop event by allowing PCB 22 to move laterally in a direction such as a direction parallel to surfaces 22T and 22B of PCB 22 (i.e., in the x-y plane of FIG. 9 as indicated by arrows 46). The elastomeric properties of members 30 may help ensure that, following a jarring event such as a drop event in which PCB 22 moves laterally, PCB 22 returns to its properly aligned position within device 10. In this way, elastomeric members 30 may help ensure that connectors and other structures in device 10 that benefit from proper alignment of PCB 22 in housing 12 remain in proper position for carrying out their respective functions.

The foregoing is merely illustrative of the principles of this invention and various modifications can be made by those skilled in the art without departing from the scope and spirit of the invention.

What is claimed is:

1. An electronic device, comprising:
    a housing;
    a printed circuit board having a plurality of padded through-holes;
    a structural member; and
    a plurality of engagement members, wherein each engagement member includes a portion that is formed within a corresponding one of the padded through-holes and wherein the printed circuit board is secured to the housing using the plurality of engagement members, wherein the structural member comprises a plurality of holes and a plurality of recessed portions, wherein each of the holes is formed in a respective one of the recessed portions, and wherein each of the padded through-holes in the printed circuit board comprises:
        an opening in the printed circuit board that extends from a first surface of the printed circuit board to a second surface of the printed circuit board; and
        an elastomeric member in the opening, wherein the portion of each engagement member that is formed within the corresponding one of the padded through-holes is formed in contact with the elastomeric member in the opening.

2. The electronic device defined in claim 1, further comprising:
    a plurality of additional engagement members attached to the housing.

3. The electronic device defined in claim 2 wherein each engagement member includes an additional portion that engages with a corresponding one of the additional engagement members that are attached to the housing.

4. The electronic device defined in claim 3 wherein each additional engagement member comprises a metal engagement member that is welded to the housing.

5. The electronic device defined in claim 3, further comprising:
    at least one electronic component attached to the printed circuit board.

6. The electronic device defined in claim 5 wherein a portion of each of the additional engagement members is interposed between the printed circuit board and the housing and wherein the at least one electronic component is attached to the printed circuit board between the printed circuit board and the housing.

7. The electronic device defined in claim 1, wherein the structural member is secured to the printed circuit board using the plurality of engagement members.

8. The electronic device defined in claim 7, further comprising:
    a plurality of attachment members, wherein each attachment member is engaged with a corresponding one of the plurality of engagement members.

9. The electronic device defined in claim 8 wherein each attachment member includes a portion within a corresponding one of the plurality of holes.

10. The electronic device defined in claim 7, further comprising:
    at least one electronic component attached to the printed circuit board.

11. The electronic device defined in claim 10 wherein a portion of each of the engagement members is interposed between the printed circuit board and the structural member and wherein the at least one electronic component is attached to the printed circuit board between the printed circuit board and the structural member.

12. The electronic device defined in claim 1 wherein each elastomeric member comprises a material having a hardness durometer value between 35 and 40.

13. A printed circuit board, comprising:
a printed circuit board substrate having openings configured to receive engagement structures that mount the printed circuit board to a support structure;
first and second standoffs, wherein the first standoff has an opening that receives an associated one of the engagement structures; and
a plurality of conductive elastomeric members formed in the openings in the printed circuit board substrate, wherein one of the conductive elastomeric members is interposed between the first and second standoffs.

14. The printed circuit board defined in claim 13 wherein each of the conductive elastomeric members comprises silicone.

15. The printed circuit board defined in claim 14, further comprising:
a conductive ground layer, wherein each of the conductive elastomeric members comprises an electrically conductive elastomeric member having at least a portion formed in contact with the conductive ground layer.

16. The printed circuit board defined in claim 14 wherein each of the conductive elastomeric members comprises a thermally conductive elastomeric member configured to conduct heat away from the printed circuit board substrate.

17. The printed circuit board defined in claim 14 wherein each of the conductive elastomeric members further comprises a metal selected from the group consisting of: copper, zinc, nickel, and silver.

18. An electronic device, comprising:
a housing;
a printed circuit board having a plurality of openings;
a plurality of elastomeric members, wherein each of the elastomeric members is formed in a corresponding one of the openings;
a first set of engagement members attached to the housing;
a second set of engagement members attached to the first set of engagement members through the openings in the printed circuit board;
a plurality of attachment members; and
a cowling structure attached to the second set of engagement members using the plurality of attachment members.

19. The electronic device defined in claim 18 wherein each of the elastomeric members comprises a first portion formed in contact with a surface of the corresponding one of the openings, a second portion formed in contact with a first surface of the printed circuit board, and a third portion formed in contact with an opposing second surface of the printed circuit board, wherein each of the second set of engagement members includes a portion formed in contact with the first portion of a selected one of the elastomeric members, and wherein the elastomeric members are configured to allow the printed circuit board to move relative to the housing in a direction parallel to the first and second surfaces of the printed circuit board when a sudden force is applied to the housing.

20. The electronic device defined in claim 19 wherein each of the first set of engagement members comprises an opening, wherein the second set of engagement members each include a first portion in the opening in the an associated one of the first set of engagement members, a second portion in a corresponding opening in the printed circuit board, and a third portion interposed between the printed circuit board and the cowling structure.

21. The electronic device defined in claim 18 wherein the plurality of attachment members comprises a plurality of screws that engage in openings in the second set of engagement members.

22. The printed circuit board defined in claim 18 wherein each of the elastomeric members comprises silicone infused with a metal selected from the group consisting of: copper, zinc, nickel, and silver.

* * * * *